(12) United States Patent
Park et al.

(10) Patent No.: US 9,130,524 B2
(45) Date of Patent: Sep. 8, 2015

(54) LINEAR AMPLIFIER AND MULTISTAGE LINEAR AMPLIFIER

(75) Inventors: Jong Hoon Park, Incheon (KR); Chang Hyun Lee, Seoul (KR); Chang Kun Park, Gyeonggi-do (KR)

(73) Assignee: SOONGSIL UNIVERSITY RESEARCH CONSORTIUM TECHNO-PARK, Seoul (KR)

( * ) Notice: Subject to any disclaimer, the term of this patent is extended or adjusted under 35 U.S.C. 154(b) by 64 days.

(21) Appl. No.: 14/347,634

(22) PCT Filed: Nov. 7, 2011

(86) PCT No.: PCT/KR2011/008409
§ 371 (c)(1),
(2), (4) Date: Mar. 26, 2014

(87) PCT Pub. No.: WO2013/047947
PCT Pub. Date: Apr. 4, 2013

(65) Prior Publication Data
US 2014/0232466 A1    Aug. 21, 2014

(30) Foreign Application Priority Data

Sep. 30, 2011 (KR) .......................... 10-2011-0099614

(51) Int. Cl.
| H03F 3/04 | (2006.01) |
| H03G 3/00 | (2006.01) |
| H03F 1/22 | (2006.01) |
| H03F 1/32 | (2006.01) |
| H03F 3/21 | (2006.01) |
| H03F 3/193 | (2006.01) |
| H03F 1/02 | (2006.01) |
| H03F 3/195 | (2006.01) |

(52) U.S. Cl.
CPC ............... *H03G 3/00* (2013.01); *H03F 1/0266* (2013.01); *H03F 1/223* (2013.01); *H03F 1/3205* (2013.01); *H03F 3/193* (2013.01); *H03F 3/195* (2013.01); *H03F 3/211* (2013.01); *H03F 2200/18* (2013.01); *H03F 2200/451* (2013.01); *H03F 2203/21106* (2013.01); *H03F 2203/21112* (2013.01); *H03F 2203/21142* (2013.01)

(58) Field of Classification Search
USPC .................................................. 330/311, 277
IPC ......................................................... H03F 3/04
See application file for complete search history.

(56) References Cited

U.S. PATENT DOCUMENTS

| 4,586,004 | A  * | 4/1986 | Valdez ........................... 330/300 |
| 6,204,719 | B1 * | 3/2001 | Gilbert .......................... 327/349 |
| 6,556,085 | B2   | 4/2003 | Kwon et al. |
| 8,143,950 | B2   | 3/2012 | Hwang et al. |

(Continued)

FOREIGN PATENT DOCUMENTS

| KR | 10-2002-0055473 A | 7/2002 |
| KR | 10-2006-0090525 A | 8/2006 |
| KR | 10-2011-0076335 A | 7/2011 |

*Primary Examiner* — Patricia T Nguyen
(74) *Attorney, Agent, or Firm* — Revolution IP, PLLC

(57) ABSTRACT

Disclosed is a linear amplifier which includes: a common source transistor with the gate connected with an input node; a first common gate transistor connected with the common source transistor in a cascode type, with the drain connected with an output node; and a second common gate transistor connected in parallel with the first common gate transistor, with the gate connected with the input node and the drain connected with the output node.

9 Claims, 7 Drawing Sheets

(56) References Cited

U.S. PATENT DOCUMENTS

| | | |
|---|---|---|
| 2006/0046681 A1* | 3/2006 | Bagheri et al. ............... 455/333 |
| 2006/0223485 A1* | 10/2006 | Kim et al. ..................... 455/339 |
| 2007/0222515 A1* | 9/2007 | Koutani et al. ............... 330/254 |
| 2008/0079499 A1* | 4/2008 | Tsai .............................. 330/311 |
| 2008/0290947 A1* | 11/2008 | Dawe ............................ 330/282 |
| 2011/0156817 A1* | 6/2011 | Hwang et al. ................ 330/277 |

* cited by examiner

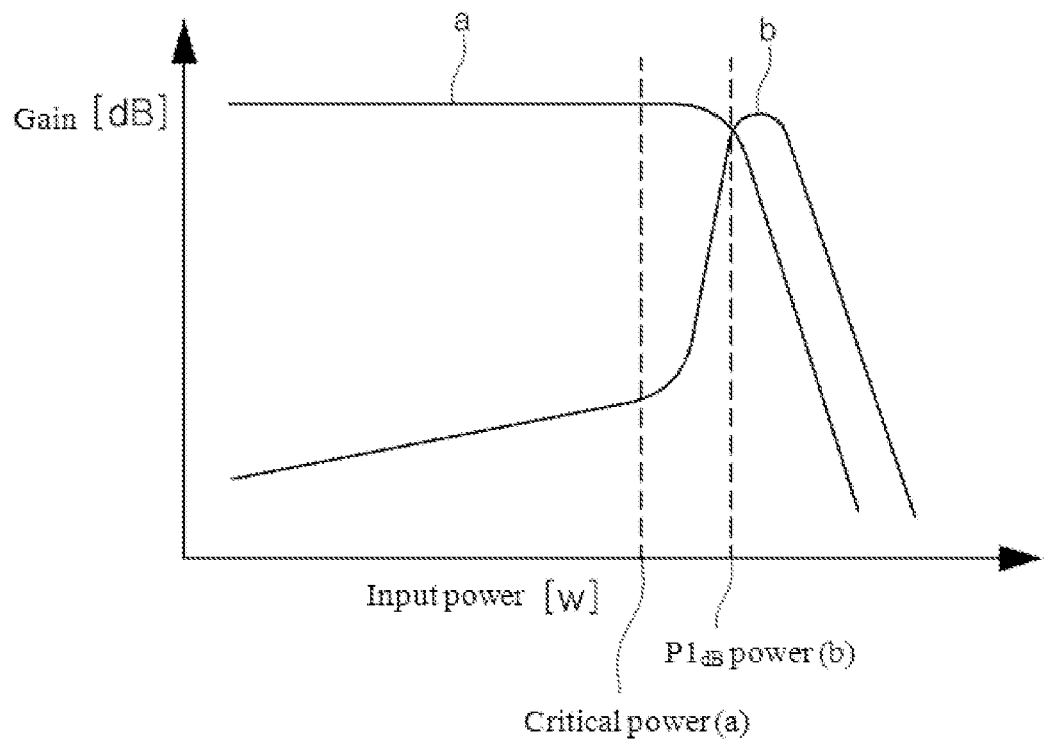

LINEAR AMPLIFIER AND MULTISTAGE LINEAR AMPLIFIER

CROSS REFERENCE TO PRIOR APPLICATIONS

This application is a National Stage Application of PCT International Patent Application No. PCT/KR2011/008409 filed on Nov. 7, 2011, under 35 U.S.C. §371, which claims priority to Korean Patent Application No. 10-2011-0099614 filed on Nov. 30, 2011, which are all hereby incorporated by reference in their entirety.

TECHNICAL FIELD

The present invention relates to a linear amplifier and a multistage amplifier, and more particularly to a technology of improving the gain of a linear amplifier, using a transistor connected in a cascode type.

BACKGROUND ART

Recently, the processes for manufacturing high-frequency devices have been developed to make circuits more integrated by increasing the operation frequency of the circuits and continuously reduce the manufacturing cost of the high-frequency circuits accordingly. Further, the development of the processes allows for high-frequency circuits with a low power consumption characteristic by making it easy to lower power voltage.

FIG. 1 is a diagram illustrating the configuration of a linear amplifier according to the related art and FIG. 2 is an exemplary diagram illustrating gain characteristic of the linear amplifier illustrated in FIG. 1. Referring to FIG. 1, in a linear amplifier 100 of the related art, a common source transistor 110 and a common gate transistor 120 are connected in a cascode type. The gate of the common source transistor 110 is connected with an input node 105 and a capacitor 155 is connected between the gate and the input node 105, such that a DC component in an input can be blocked. Further, in the common gate transistor 120, a gate voltage is applied to the gate through a gate voltage node 125 and a reference voltage VDD is applied to the drain through a reference voltage node 135. In this case, an inductor 145 is connected between the reference voltage node 135 and the drain of the common gate transistor 120.

The reason of configuring the liner amplifier in a cascode type can be largely divided into two cases. One is for increasing the gain of the amplifier by configuring the linear amplifier in a cascode type. The other is for protecting the transistors in the linear amplifier. Since linear amplifiers usually generate large output power, the magnitude of the voltage at the output node increases and the drain-source voltage of the transistors in the linear amplifiers considerably drops, such that transistors may break due to overloads when it is over the yield voltage that the drain-source can support. This phenomenon can be attenuated in the linear amplifier of a cascode type, because the common source transistor and the common gate transistor, which are connected in series, distribute a voltage.

Referring to FIG. 2, $P1_{dB}$ power, a reference for determining linearity of a linear amplifier, means an input power point when a 1 dB gain reduces in comparison to the gain in the linear section. In the gain curve (a) for a linear amplifier of a cascode type, it can be seen that the gain reduces at input power of a predetermined level or more. This means that linearity is not maintained any more. Accordingly, it may be possible to increase the size of the common gate transistor of the linear amplifier illustrated in FIG. 1 in order to improve linearity of the linear amplifier. In the gain curve (b) of a linear amplifier with the size increased, however, there is a problem in that although the $P1_{dB}$ power increases, the gain characteristic decreases at the points with low input power.

DISCLOSURE

Technical Problem

The present invention has been made in an effort to provide a linear amplifier and a multistage amplifier of which the gain is improved without an increase in size of their transistors and does not reduce even though low power is inputted.

Technical Solution

A linear amplifier according to an embodiment of the present invention includes: a common source transistor with the gate connected with an input node; a first common gate transistor connected with the common source transistor in a cascode type, with the drain connected with an output node; and a second common gate transistor connected in parallel with the first common gate transistor, with the gate connected with the input node and the drain connected with the output node.

The linear amplifier may further include a capacitor connected between the input node and the gate of the second common gate transistor.

The linear amplifier may further include a DC bias unit connected between the gate of the second common gate transistor and the capacitor.

The linear amplifier may further include a power controller connected between the input node and the gate of the second common gate transistor and controlling the power from the input node at the level of predetermined power.

The linear amplifier may further include a low pass filter connected between the gate of the second common gate transistor and the power controller.

The threshold voltage of the second common gate may be set to a critical gain voltage where the gain of the first common gate transistor starts reducing.

A multistage linear amplifier according to another embodiment of the present invention includes a first linear amplifier and a second linear amplifier receiving power from the first linear amplifier, in which the second linear amplifier may include: a common source transistor with the source connected with the output node of the first linear amplifier; a first common gate transistor connected with the common source transistor in a cascode type, with the drain connected with the output node of the multistage linear amplifier; and a second common gate transistor connected in parallel with the first common gate transistor, with the gate connected with the input node of the multistage linear amplifier and the drain connected with the output node of the multistage linear amplifier.

The multistage linear amplifier may further include a power controller connected between the input node of the multistage linear amplifier and the gate of the second common gate transistor and controlling the power from the input node of the multistage linear amplifier at the level of predetermined power.

The linear amplifier may further include a low pass filter connected between the power controller and the gate of the second common gate transistor.

Advantageous Effects

As described above, according to the present invention, it is possible to improve a gain without increasing the size of a transistor and improve linearity of a linear amplifier because the gain is not decreased even with low input power, by adding a common gate transistor that is connected in parallel with a common gate transistor of the transistors in the linear amplifier.

DESCRIPTION OF DRAWINGS

FIGS. 6A and 6B are exemplary views illustrating the gain characteristics of the linear amplifiers illustrated in FIGS. 3 to 5.

BEST MODE

Hereinafter, embodiments of the present invention are described with reference to the accompanying drawings. The terms used herein are terms selected in consideration of the functions in the embodiments and their meanings may depend on the intention of users and workers or precedents. Therefore, the meanings of the terms used in the following embodiments follow the definitions, if defined in detail herein, or should be construed as the meanings that those skilled in the art know, if not defined in detail.

Figure 3:
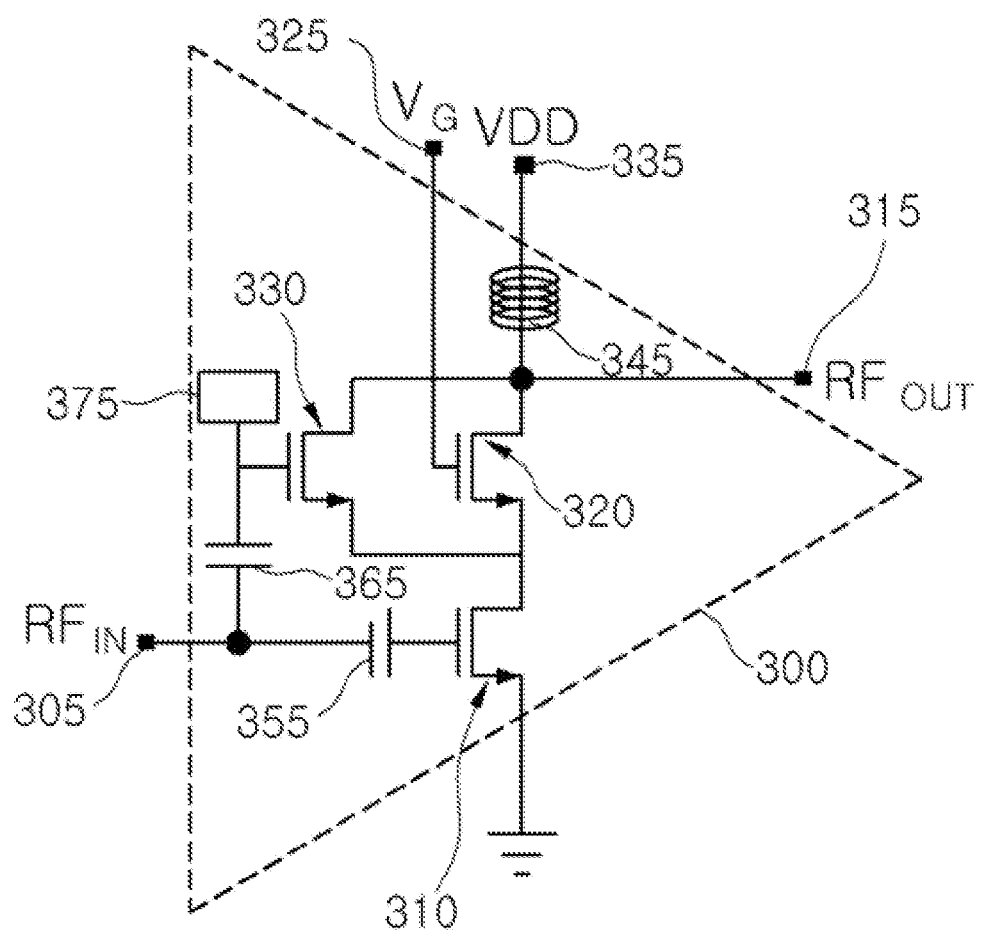
FIG. 3 is a diagram illustrating the configuration of a linear amplifier according to an embodiment of the present invention.

FIG. 3 is a diagram illustrating the configuration of a linear amplifier according to an embodiment of the present invention.

Referring to FIG. 3, a linear amplifier 300 according to an embodiment of the present invention includes a common source transistor 310, a first common gate transistor 320, and a second common gate transistor 330. In the common source transistor 310, the gate is connected with an input node 305, the source is grounded, and the drain is connected with the source of the first common gate transistor 320. In this configuration, a capacitor 355 may be connected between the gate of the common source transistor 310 and the input node 305. The capacitor 355 blocks the DC component of the power inputted through the input node 305. DC bias is applied to the gate of the common source transistor 310, such that the operation voltage of the common source transistor 310 can be set.

The first common gate transistor 320 is connected with the common source transistor 310 in a cascode type. In detail, in the first common gate transistor 320, the source is connected with the drain of the common source transistor 310 and the drain is connected with an output node 315. A gate voltage is applied to the gate of the first common gate transistor 320 from a gate voltage node 325. Further, a reference voltage is applied to the drain of the first common gate transistor 320 from a reference voltage node 335, in which the current flows through an inductor 345. Accordingly, the first common gate transistor 320 is connected in series with the common source transistor 310 and the voltage is distributed.

Figure 1:
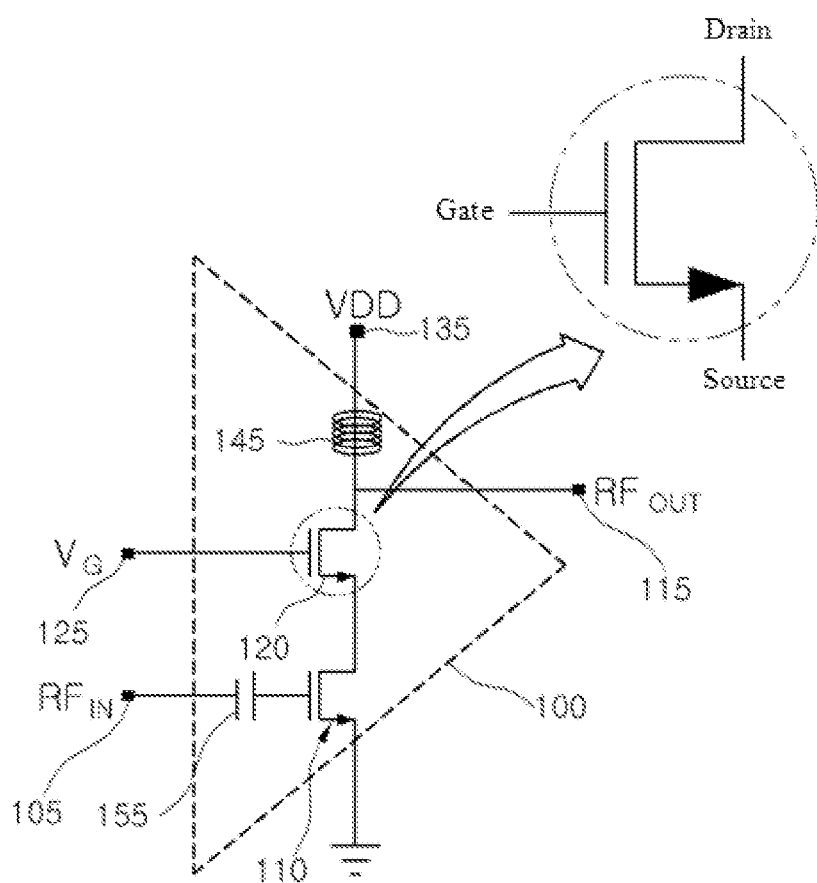
FIG. 1 is a diagram illustrating the configuration of a linear amplifier according to the related art.
Figure 2:
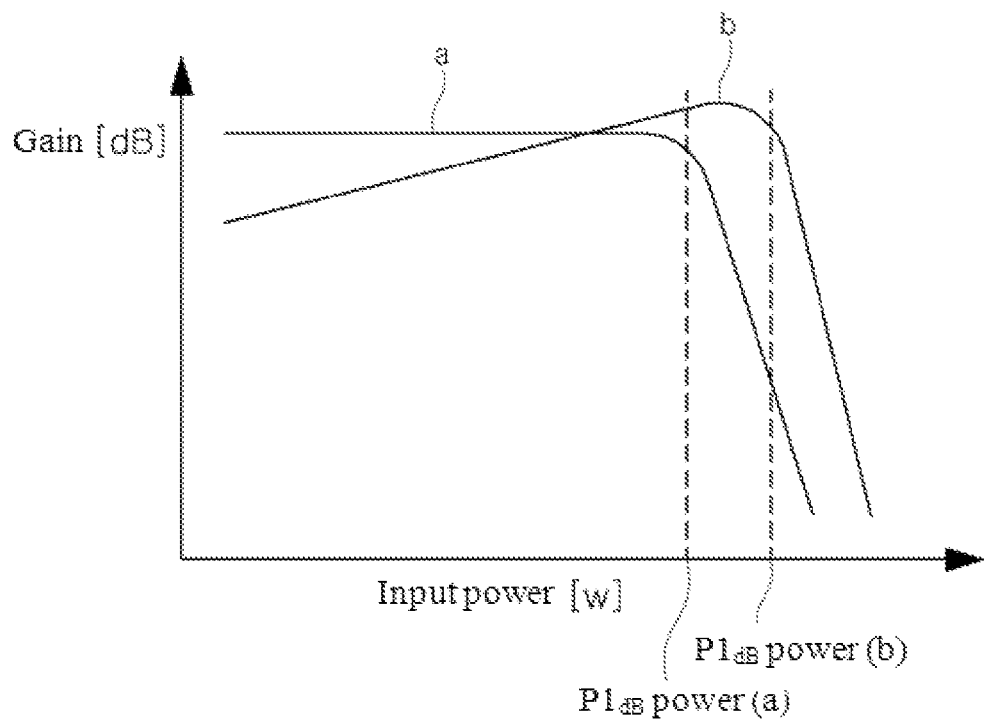
FIG. 2 is an exemplary diagram illustrating gain characteristic of the linear amplifier illustrated in FIG. 1.

The second common gate transistor 330 is connected in parallel with the first common gate transistor 320. In detail, in the second common gate transistor 330, the gate is connected with the input node 305, the drain is connected with the output node 315, and the source is connected with the junction of the source of the first common gate transistor 320 and the common source transistor 310. The second common gate transistor 330 distributes a voltage in cooperation with the first common gate transistor 320 connected in parallel with it. Accordingly, at the drain of the common source transistor 310, the channel resistance of the first common gate transistor 320 and the second common gate transistor 330 reduces. Accordingly, a loss of power of the entire linear amplifier 300 is decreased and the power from the input node 305 is increased, such that the gain further increases than that of the linear amplifier 300 illustrated in FIG. 1.

A capacitor 365 is connected between the second common gate transistor 330 and the input node 305, such that it can block the DC component of the power from the input node 305. A DC bias unit 375 may be additionally connected between the gate of the second common gate transistor 330 and the capacitor 365. The DC bias unit 375 is provided to operate the second common gate transistor 330 by applying a gate voltage to the second common gate transistor 330.

The threshold voltage (turn-on voltage) of the second common gate transistor 330 may be set higher than that of the first common gate transistor 320. That is, this is for improving the gain as compared with when there is only the first common gate transistor 320 in the related art. In detail, the threshold voltage of the second common gate transistor 330 may be set to the critical gain voltage where the gain of the first common gate transistor 320 starts decreasing. In this case, the second common gate transistor 330 operates, when the power from the input node 305 is over the critical gain voltage with only the first common gate transistor 320 in operation.

Further, the point of time when the second common gate transistor 330 starts operating may be set through the DC bias unit 375. For example, when the threshold voltage of the second common gate transistor 330 is set to 5V, the second common gate transistor 330 is operated by applying 2V to the DC bias unit 375, even if the voltage of the power from the input node 305 is over 3V. Accordingly, it is possible to improve the gain of the linear amplifier 300 by controlling the point of time where the second gate transistor 330 starts operating.

Figure 4:
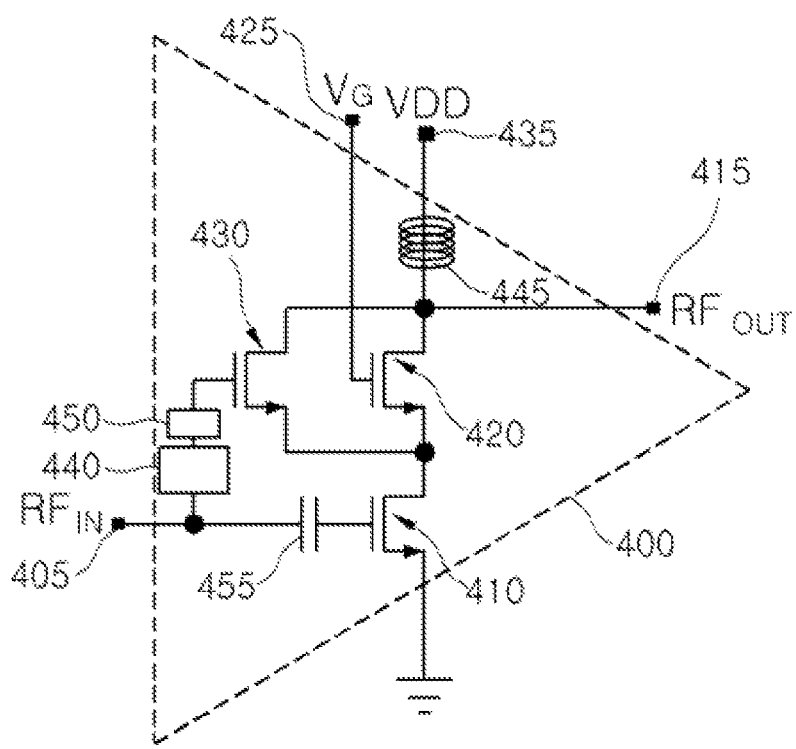
FIG. 4 is a diagram illustrating the configuration of a linear amplifier according to another embodiment of the present invention.

FIG. 4 is a diagram illustrating the configuration of a linear amplifier according to another embodiment of the present invention.

Referring to FIG. 4, the linear amplifier 400 includes a common source transistor 410, a first common gate transistor 420, a second common gate transistor 430, a power controller 440, and a low pass filter 450. In the common source transistor 410, the gate is connected with an input node 405, the source is grounded, and the drain is connected with the source of the first common gate transistor 420. In this configuration, a capacitor 455 may be connected between the gate of the common source transistor 410 and the input node 405. Further, DC bias is applied to the gate of the common source transistor 410, such that the operation voltage of the common source transistor 410 can be set.

The first common gate transistor 420 is connected with the common source transistor 410 in a cascode type, with the source connected with the drain of the common source transistor 410 and the drain connected with an output node 415. Further, similar to the linear amplifier 300 illustrated in FIG. 3, in the first common gate transistor 420, a gate voltage is applied to the gate from a gate voltage node 425 and a reference voltage is applied to the drain from the reference voltage node 435, in which the current flows through an inductor 445.

The second common gate transistor 430 is connected in parallel with the first common gate transistor 420. In detail, in the second common gate transistor 430, the gate is connected with the input node 405, the drain is connected with the output node 415, and the source is connected with the junction of the source of the first common gate transistor 420 and the common source transistor 410. In this configuration, the power controller 440 is connected between the gate of the first common gate transistor 420 and the input node 405.

The power controller 440 controls the power from the input node 405 at the level of predetermined power. The power controller 440 outputs the input AC power into DC power. For example, the power controller 440 can control the DC power from the power controller 440 to increase or decrease it in accordance with the input AC power.

The low pass filter 450 is connected between the power controller 440 and the second common gate transistor 430. The low pass filter 450 blocks the AC component with high frequency and passes the DC component with low frequency. When there is an AC component in the power passing through the power controller 440, the AC component is blocked by the low pass filter 450, such that the power inputted to the second common gate transistor 430 can be pure DC power. The low pass filter 450 can be selectively used in accordance with setting by a user. Accordingly, when there is no need of blocking the AC power, the linear amplifier 400 may not be provided with the low pass filter 450.

The power controller 440 controls the point of time where the second common gate transistor 430 starts operating. For example, when the threshold voltage of the second common gate transistor 430 is 5V, the power controller 440 can convert and output the voltage of the power from the input node 405 to 5V or less or more for each time. In this case, the second common gate transistor 430 does not operate when the output voltage of the power controller 440 is 5V or less, and it operates when the output voltage is 5V or more. Accordingly, it is possible to improve the gain of the linear amplifier 400 by controlling the point of time where the second gate transistor 430 starts operating.

Figure 5:
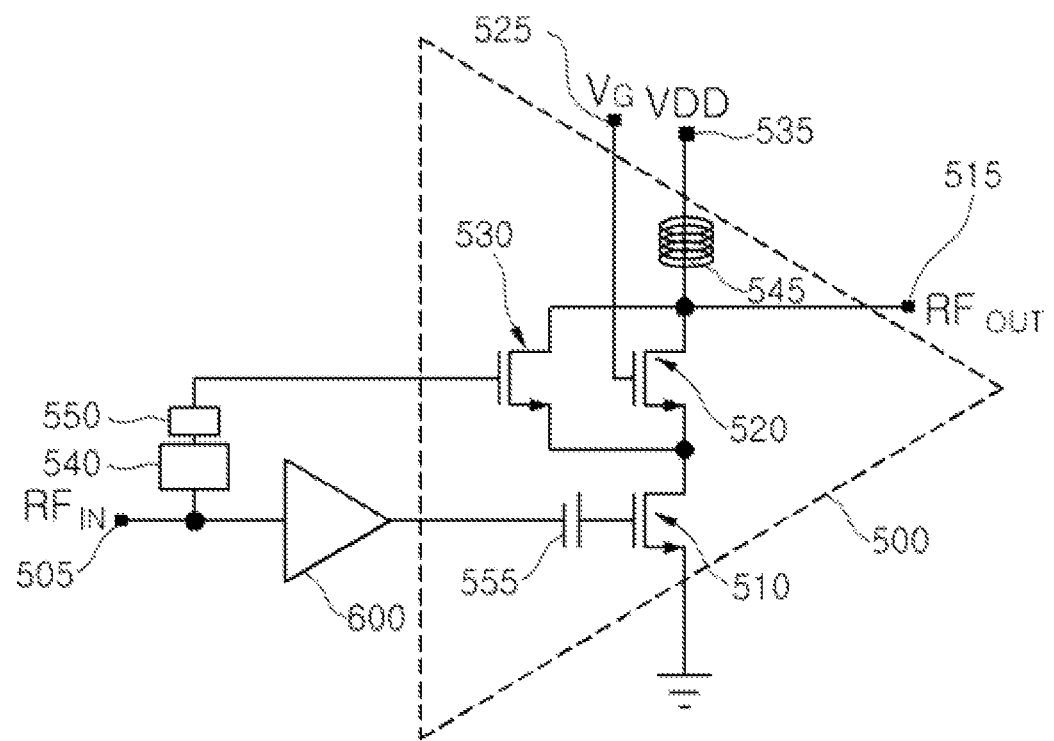
FIG. 5 is a diagram illustrating the configuration of a multistage linear amplifier according to another embodiment of the present invention.

FIG. 5 is a diagram illustrating the configuration of a multistage linear amplifier according to another embodiment of the present invention.

Referring to FIG. 5, the multistage linear amplifier includes a first linear amplifier 600 and a second linear amplifier 500. In the multistage linear amplifier, the first linear amplifier 600 functions as a driving amplifier and the second linear amplifier 500 functions as a power amplifier. The first linear amplifier 600 is connected with an input node 505 of the multistage amplifier and amplifies and outputs power to the second linear amplifier 500. The second linear amplifier 500 amplifies and outputs input power to an output node 515 of the multistage amplifier.

In detail, the second linear amplifier 500 includes a common source transistor 510, a first common gate transistor 520, and a second common gate transistor 530. In the common source transistor 510, the gate is connected with the output node 515 of the first linear amplifier 500, the source is grounded, and the drain is connected with the source of the first common gate transistor 520. In this configuration, a capacitor 555 may be connected between the gate of the common source transistor 510 and the input node 505. DC bias is applied to the gate of the common source transistor 510, such that the operation voltage of the common source transistor 510 can be set.

The first common gate transistor 520 is connected with the common source transistor 410 in a cascode type, with the source connected with the drain of the common source transistor 510 and the drain connected with the output node 515 of the second linear amplifier 500. Further, similar to the linear amplifiers 300 and 400 illustrated in FIG. 3 or FIG. 5, in the gate of the first common gate transistor 520, a gate voltage is applied to the gate from a gate voltage node 525 and a reference voltage is applied to the drain from the reference voltage node 535, in which the current flows through an inductor 545.

The second common gate transistor 530 is connected in parallel with the first common gate transistor 520. In the second common gate transistor 530, the gate is connected with the input node 505 of the multistage linear amplifier, the drain is connected with the output node 515 of the second linear amplifier 500, and the source is connected with the junction of the source of the first common gate transistor 520 and the common source transistor 510. In this configuration, a power controller 540 and a low pass filter 550 are connected between the gate of the second common gate transistor 530 and the input node 505 of the second linear amplifier 500. The power controller 540 and the low pass filter 550 included in the configuration illustrated in FIG. 5 perform substantially the same functions as those of the power controller 540 and the low pass filter 550 illustrated in FIG. 4. The threshold voltage of the second common gate transistor 530 can be controlled through the power controller 540 or the input power.

Figure 6B:
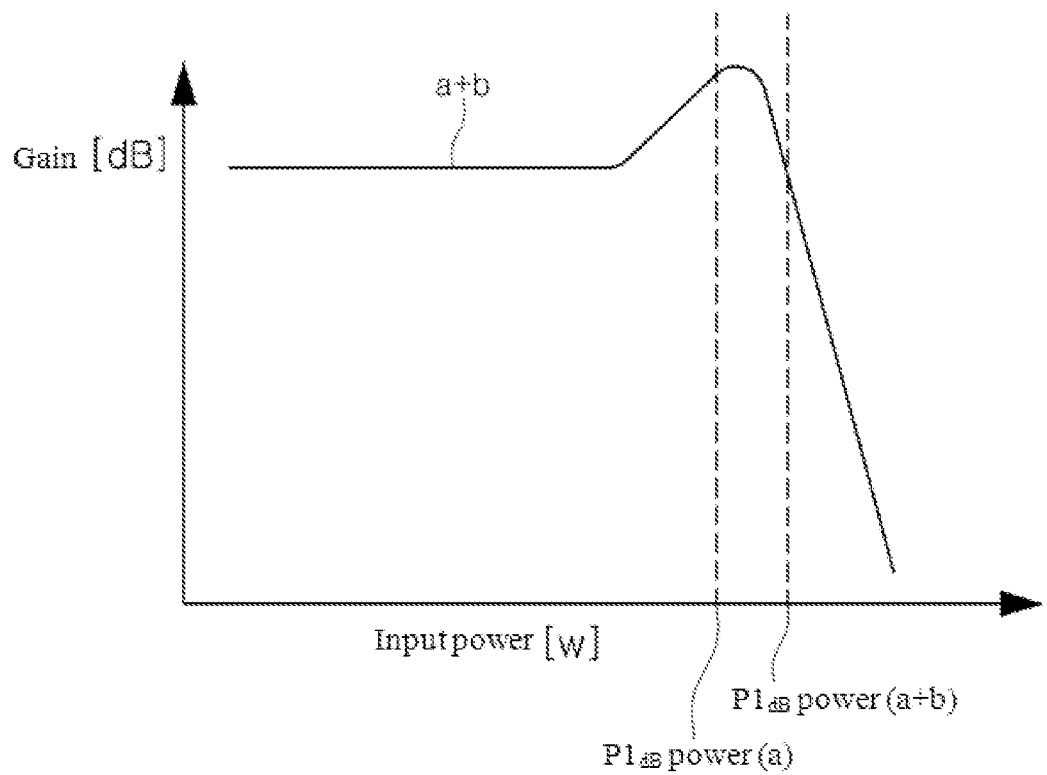

FIGS. 6A and 6B are exemplary views illustrating the gain characteristics of the linear amplifiers illustrated in FIGS. 3 to 5.

Referring to FIG. 6A, the first common gate transistors 320, 420, and 520 operate with low input power, because their threshold voltages are lower than those of the second common gate transistors 330, 430, and 530. However, the second common gate transistors 330, 430, and 530 start operating at the threshold power that is the point of time where the gains of the first common gate transistors 320, 420, and 520 starts reducing with an increase of input power. The gain curve illustrated in FIG. 6B can be obtained by combining the gain curve (a) of the first common gate transistors 320, 420, and 520 with the gain curve (b) of the second common gate transistors 330, 430, and 530.

Referring to FIG. 6B, it can be seen that the $P1_{dB}$ power of the linear amplifiers 300, 400, and 500 including all of the first common gate transistors 320, 420, and 520 and the second common gate transistors 330, 430, and 530 increased further than the $P1_{dB}$ power of the linear amplifier 100 where only the first common gate transistors 320, 420, and 520 were operated. This means that the linearity of the linear amplifier 300, 400, and 500 was improved. Further, it can be seen that the whole gains of the linear amplifiers 300, 400, and 500 were not decreased even with low input power. Accordingly, it can be seen that the linearity of the linear amplifiers 300, 400, and 500 illustrated in FIGS. 3 to 5 was improved in comparison to that of the linear amplifier 100 of the related art illustrated in FIG. 1 and the gains were not decreased even with low input power.

As described above, according to the present invention, it is possible to improve a gain without increasing the size of a transistor and improve linearity of a linear amplifier because the gain is not decreased even with low input power, by adding a common gate transistor that is connected in parallel with a common gate transistor of the transistors in the linear amplifier.

Although the present invention has been described on the basis of the embodiments described with reference to the drawings, but it is not limited thereto. Therefore, the present invention should be construed on the basis of claims intended for including modifications that can be achieved apparently from the embodiments.

The invention claimed is:

1. A linear amplifier comprising:
   a common source transistor with the gate connected with an input node;
   a first common gate transistor connected with the common source transistor in a cascode type, with the drain connected with an output node; and
   a second common gate transistor connected in parallel with the first common gate transistor, with the gate connected with the input node and the drain connected with the output node.

2. The linear amplifier of claim 1, further comprising a capacitor connected between the input node and the gate of the second common gate transistor.

3. The linear amplifier of claim 2, further comprising a DC bias unit connected between the gate of the second common gate transistor and the capacitor.

4. The linear amplifier of claim 1, further comprising a power controller connected between the input node and the gate of the second common gate transistor and controlling the power from the input node at the level of predetermined power.

5. The linear amplifier of claim 4, further comprising a low pass filter connected between the gate of the second common gate transistor and the power controller.

6. The linear amplifier of claim 4, wherein the threshold voltage of the second common gate transistor is set to a critical gain voltage where the gain of the first common gate transistor starts reducing.

7. A multistage linear amplifier comprising a first linear amplifier and a second linear amplifier receiving power from the first linear amplifier,
   wherein the second linear amplifier includes:
   a common source transistor with the source connected with the output node of the first linear amplifier;
   a first common gate transistor connected with the common source transistor in a cascode type, with the drain connected with the output node of the multistage linear amplifier; and
   a second common gate transistor connected in parallel with the first common gate transistor, with the gate connected with the input node of the multistage linear amplifier and the drain connected with the output node of the multistage linear amplifier.

8. The multistage linear amplifier of claim 7, further comprising a power controller connected between the input node of the multistage linear amplifier and the gate of the second common gate transistor and controlling the power from the input node of the multistage linear amplifier at the level of predetermined power.

9. The linear amplifier of claim 8, further comprising a low pass filter connected between the power controller and the gate of the second common gate transistor.

* * * * *